(12) United States Patent
Ueda et al.

(10) Patent No.: US 9,091,398 B2
(45) Date of Patent: Jul. 28, 2015

(54) LIGHT

(75) Inventors: Yasuhisa Ueda, Osaka (JP); Kazuhiro Kawabata, Kagawa (JP); Masahiro Miki, Osaka (JP); Takaari Uemoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/118,595

(22) PCT Filed: Jan. 31, 2012

(86) PCT No.: PCT/JP2012/000611

§ 371 (c)(1),
(2), (4) Date: Nov. 19, 2013

(87) PCT Pub. No.: WO2012/160731

PCT Pub. Date: Nov. 29, 2012

(65) Prior Publication Data

US 2014/0103794 A1    Apr. 17, 2014

(30) Foreign Application Priority Data

May 20, 2011    (JP) .................................. 2011-113943

(51) Int. Cl.
| F21K 99/00 | (2010.01) |
| F21V 23/00 | (2015.01) |
| F21V 23/02 | (2006.01) |
| F21V 3/00 | (2015.01) |
| F21Y 101/02 | (2006.01) |

(Continued)

(52) U.S. Cl.
CPC ............. F21K 9/1355 (2013.01); F21V 23/001 (2013.01); F21V 23/002 (2013.01);
(Continued)

(58) Field of Classification Search
CPC .............................. F21K 9/1355; F21V 23/001

USPC ...................................................... 313/318.01
See application file for complete search history.

(56) References Cited

U.S. PATENT DOCUMENTS 4,988,921 A * 1/1991 Ratner et al. .................. 315/159
7,293,897 B2 * 11/2007 Mendelsohn ................. 362/260
(Continued)

FOREIGN PATENT DOCUMENTS

| JP | 2002-312892 | 10/2002 |
| JP | 2007-250341 | 9/2007 |

(Continued)

OTHER PUBLICATIONS

International Search Report for PCT/JP2012/000611 dated Apr. 3, 2012 w/English language translation.

(Continued)

*Primary Examiner* — Nimeshkumar Patel
*Assistant Examiner* — Jacob R Stern
(74) *Attorney, Agent, or Firm* — Greenblum & Bernstein, P.L.C.

(57) ABSTRACT

A lamp includes an LED module, a drive unit supplying power to the LED module, and a base via which power is fed from an external power supply to the drive unit. The drive unit is located between the LED module and the base. The drive unit includes a circuit board having a main surface on which lead-type electronic components are mounted, lead wires (first lead wires) extending from the main surface of the circuit board and connected to the LED module, and lead wires (second lead wires) extending from the main surface of the circuit board and connected to the base. The circuit board has a through-hole extending from the main surface to an opposite surface thereof. The lead wires pass through the through-hole.

10 Claims, 10 Drawing Sheets

(51) Int. Cl.
*F21Y 103/00* (2006.01)
*H05K 3/34* (2006.01)

(52) U.S. Cl.
CPC ............... *F21V 23/02* (2013.01); *F21K 9/175* (2013.01); *F21K 9/50* (2013.01); *F21K 9/58* (2013.01); *F21V 3/00* (2013.01); *F21Y 2101/02* (2013.01); *F21Y 2103/003* (2013.01); *H05K 3/3447* (2013.01); *H05K 2201/09063* (2013.01); *H05K 2201/10106* (2013.01); *H05K 2201/10287* (2013.01); *H05K 2201/10492* (2013.01); *H05K 2201/10962* (2013.01)

(56) References Cited

U.S. PATENT DOCUMENTS 8,110,753 B2 * 2/2012 Chen et al. .................... 174/262
2010/0141132 A1 * 6/2010 Shen ............................. 313/504
2010/0164348 A1 7/2010 Huang et al.
2010/0301729 A1 * 12/2010 Simon et al. ................... 313/46
2011/0090699 A1 * 4/2011 Shida et al. .................... 362/294
2012/0069545 A1 * 3/2012 Choi et al. ....................... 362/84

FOREIGN PATENT DOCUMENTS

JP          2008-257995         10/2008
JP          2010-278127         12/2010
WO          2008/126394         10/2008

OTHER PUBLICATIONS

Search report from E.P.O., mail date is Sep. 25, 2014.

* cited by examiner

LIGHT

TECHNICAL FIELD

The present invention relates to a lamp.

BACKGROUND ART

A light-emitting diode (an LED) module lamp (an LED lamp) 101 as illustrated in FIG. 10 has been proposed (see Patent Literature 1).

This lamp 101 includes: an LED module 120 as a light source; a drive unit 180 for supplying power to the LED module 120; a screw type base 130 as a feed unit via which power is fed from an external power supply to the drive unit; a housing 160 in the shape of a funnel having a top wall and a side wall; and a globe 110 approximately in the shape of a hemisphere. The LED module 120 and the base 130 are attached to an outer wall of the housing 160, and the drive unit 180 is housed in the housing 160. The globe 110 is joined to the housing 160 so as to cover the LED module 120 mounted on an outer surface of the top wall of the housing 160.

The drive unit 180 is composed of a circuit board 180a and lead-type electronic components 180b mounted on the circuit board 180a. The electronic components 180b are mounted on a main surface of the circuit board 180a. Furthermore, lead wires 170a, 170b, 171a, and 171b are soldered onto the circuit board 180a so that the lead wires 170a and 170b extend from the main surface toward the light source, and the lead wires 171a and 171b extend from the main surface toward the base 130 as the feed unit. That is to say, the lead wires 170a, 170b, 171a, and 171b are connected to the circuit board 180a in the following common method: in a state where the lead wires 170a, 170b, 171a, and 171b extend from the main surface of the circuit board 180, soldering is performed with respect to a surface opposite the main surface. The LED module 120 and the drive unit 180 are electrically connected to each other via the lead wires 170a and 170b. The lead wires 170a and 170b pass through openings 118a and 118b provided in the top wall of the housing 160. The drive unit 180 and the base 130 are electrically connected to each other via the lead wires 171a and 171b. The drive unit 180 receives, from the base 130 via the lead wires 171a and 171b, power supplied from the external power supply, and supplies the power to the LED module 120 via the lead wires 170a and 170b. The circuit board 180a of the drive unit 180 typically has lead-type electronic components mounted thereon, and is provided inside the housing 160 such that the main surface from which the lead wires 170a, 170b, 171a, and 171b extend faces the base 130, and a solder surface that is a back side of the circuit board 180a faces toward the top wall of the housing 160 or the light source.

CITATION LIST

Patent Literature

[Patent Literature 1]
Japanese Patent Application Publication No. 2009-127679

SUMMARY OF INVENTION

Technical Problem

In the lamp 101 having the structure illustrated in FIG. 10, in order to connect the LED module 120 to the drive unit 180 via the lead wires 170a and 170b, the lead wires 170a and 170b, which extend from the main surface of the circuit board 180a, are curved to turn in an opposite direction so that ends of the lead wires 170a and 170b are drawn from the opposite surface of the circuit board 180a toward the light source, and introduced into the globe 110 through the openings 118a and 118b in the top wall of the housing 160. To achieve this structure, it is necessary to leave, between an outer periphery of the circuit board 180a and an inner side wall of the housing 160, spaces Sa and Sb to draw the lead wires 170a and 170b from the opposite surface, i.e. spaces to form the openings 118a and 118b. Accordingly, the housing 160 cannot be reduced in size, interfering with miniaturization of the whole lamp 101.

In order to eliminate the need for the spaces Sa and Sb between the circuit board 180a and the housing 160, thereby reducing the size of the lamp, introduction of a structure eliminating the need to turn the lead wires in the opposite direction is considered. In this structure, the lead wires 170a and 170b are directly drawn from the opposite surface of the circuit board, i.e. in a state where the lead wires extend from the opposite surface of the circuit board 180a, soldering is performed with respect to the main surface of the circuit board. When the flow soldering is performed, however, it is necessary to dip the opposite surface of the circuit board 180a into a solder bath. With the structure in which the lead wires 170a and 170b directly extend from the opposite surface, the lead wires 170a and 170b themselves are dipped into the solder bath, and thus it is unavoidable to affect the lead wires 170a and 170b. To address this problem, a structure in which, after the electronic components 180b are soldered by flow soldering, the lead wires 170a and 170b are soldered in a separate step in a state where the lead wires 170a and 170b extend from the opposite surface is considered. This structure, however, can result in a reduction in productivity and an increase in manufacturing cost, as soldering has to be performed manually and in multiple steps.

The present invention has been conceived in view of the above-mentioned problems, and aims to provide a lamp that can be reduced in size and can reduce the manufacturing cost.

Solution to Problem

In order to achieve the above-mentioned aim, a lamp pertaining to the present invention is a lamp comprising: a feed unit configured to receive power from an external power supply; a light source; and a drive unit located between the feed unit and the light source, wherein the drive unit includes: a circuit board having a first main surface, a second main surface, and a through-hole extending from the first main surface to the second main surface, an electric component being mounted on at least one of the first main surface and the second main surface; a first lead wire connected to the first main surface at one end and connected to the light source at the other end; and a second lead wire extending from the first main surface and connected to the feed unit, and at least one of the light source and the feed unit faces the second main surface, and at least one of the first lead wire and the second lead wire connected to the at least one of the light source and the feed unit facing the second main surface passes through the through-hole.

Advantageous Effects of Invention

According to this structure, there is no need to leave, between an outer periphery of the circuit board and an inner side wall of a housing, spaces to turn one of the first and second lead wires in an opposite direction and draw the one of the first and second lead wires from the second main surface of the circuit board, leading to miniaturization of the whole lamp.

Furthermore, since lead-type electronic components and lead wires can extend from the first main surface, adversely affecting the electronic components and the lead wires is prevented. Flow soldering can be performed with respect to the opposite surface of the circuit board. As a result, a manufacturing cost can be reduced.

In the lamp pertaining to the present invention, a minimum distance between the through-hole and a part of the at least one of the first lead wire and the second lead wire connected to the at least one of the light source and the feed unit facing the second main surface may be equal to or greater than a distance determined based on flex resistance of the at least one of the first lead wire and the second lead wire connected to the at least one of the light source and the feed unit facing the second main surface.

According to this structure, the bend radius of one of the first and the second lead wires that is drawn from the second main surface of the circuit board can be made to be equal to or greater than the distance determined based on the flex resistance of the one of the first and second lead wires. As a result, breaking of the lead wires is suppressed and the reliability of the lamp is improved.

In the lamp pertaining to the present invention, the through-hole may be at a central part of the circuit board, and one end of each of the first lead wire and the second lead wire may be connected to an edge part of the first main surface of the circuit board.

According to this structure, the bend radius of each of the first and second lead wires can easily be increased, leading to ease of manufacture.

In the lamp pertaining to the present invention, the through-hole may have a wide part and two narrow parts extending from the wide part in different directions in plan view.

According to this structure, one of the first and second lead wires can easily be drawn from the second main surface, leading to ease of manufacture.

In the lamp pertaining to the present invention, the through-hole may be in a T shape.

In the lamp pertaining to the present invention, the feed unit may be a base.

The lamp pertaining to the present invention may further includes a housing that is tubular and houses the drive unit therein, wherein the base may be in a shape of a closed-end tube, and attached to the housing so as to cover an opening of the housing, and a space may be defined by the first main surface of the circuit board, and an inner surface of the housing, and an inner surface of the base, and, in the space, a distance between the first main surface and a bottom of the base may be equal to or greater than a minimum bend radius of each of the first lead wire and the second lead wire determined based on the flex resistance of each of the first lead wire and the second lead wire.

According to this structure, the bend radius of one of the first and the second lead wires that is drawn from the second main surface of the circuit board can surely be made to be equal to or greater than the minimum bend radius determined based on the flex resistance of the one of the first and second lead wires. As a result, breaking of the lead wires is suppressed and the reliability of the lamp is improved.

In the lamp pertaining to the present invention, the housing may be cylindrical, and a central axis of the housing may intersect with the circuit board.

In the lamp pertaining to the present invention, the electric component may be mounted on the first main surface of the circuit board by soldering the second main surface using a flow soldering method.

In the lamp pertaining to the present invention, the light source may be an LED module.

DESCRIPTION OF EMBODIMENTS

Figure 1:
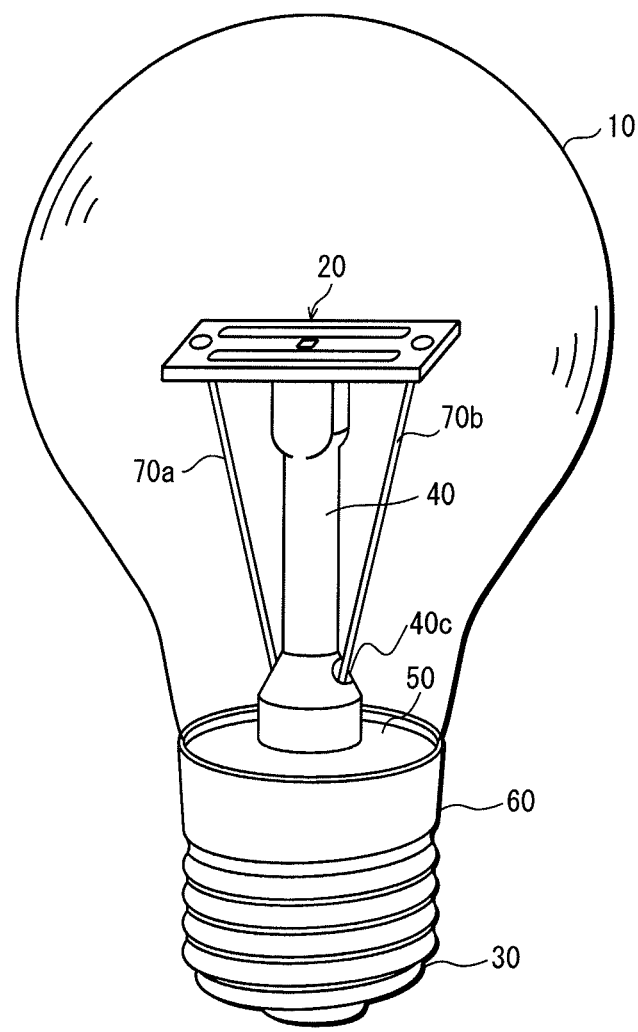
FIG. 1 is a schematic perspective view of a lamp pertaining to Embodiment 1.

As illustrated in FIG. 1, a lamp 1 pertaining to the present embodiment is a bulb-shaped LED lamp replacing an incandescent lamp, and includes a globe 10, an LED module 20 as a light source, a base 30 as a feed unit, a stem 40 for supporting the LED module 20, a support member 50 on which the stem 40 stands, and a housing 60 for housing therein a drive unit 80 for lighting the LED module 20.

Figure 2:
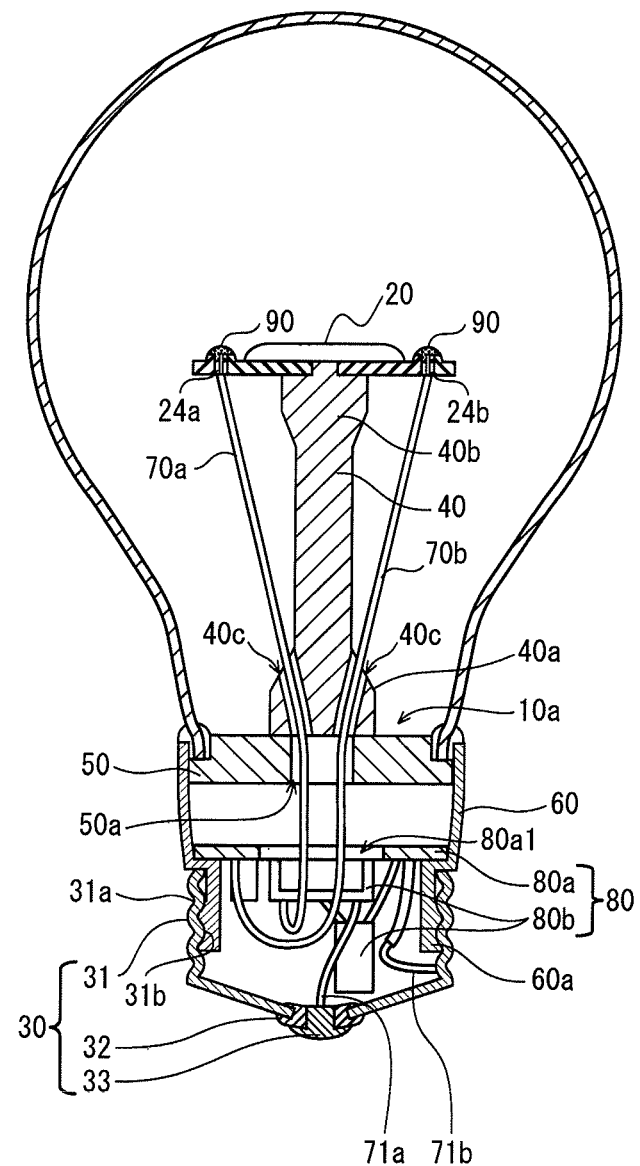
FIG. 2 is a schematic sectional view of the lamp pertaining to Embodiment 1.

As illustrated in FIG. 2, the lamp 1 further includes the drive unit 80 located inside the housing 60, lead wires (first lead wires) 70a and 70b for supplying power from the drive unit 80 to the LED module 20, and lead wires (second lead wires) 71a and 71b for supplying power from the base 30 to the drive unit 80.

The globe 10 is formed from a light-transmissive material such as silica glass and resin, and the LED module 20 is located approximately at the center of a space inside the globe 10. The globe 10 has a spherical shape being closed at one end and having an opening 10a at the other end. The globe 10 is of an A type (JIS C7710), as with a typical incandescent lamp.

The LED module 20 is a Chip-on-Board (COB) light-emitting module wherein LED chips are directly mounted on a circuit board, and is located such that a surface of the LED module 20 on which the LED chips are mounted is directed at the top of the globe 10. In the LED module 20, each of the LED chips emits light upon receiving a power supply from the drive unit 80 via the two lead wires 70a and 70b. Feed terminals 24a and 24b are provided at respective sides of the LED module 20, and electrically connected to the respective lead wires 70a and 70b by conductive joining materials 90 such as solder.

The base 30 is formed from metal so as to be approximately in the shape of a closed-end cylinder. The base 30 includes a shell 31 and an eyelet 33 attached to the shell 31 via an insulating member 32. The base 30 is an E-type base, and has a screw part 31a formed on an outer circumferential surface of the shell 31 to screw the base 30 into a socket of a lighting apparatus (not illustrated). On an inner circumferential surface of the shell 31, a screw part 31b is formed to screw the housing 60 into the base 30. The base 30 is attached to the housing 60 so as to cover a screw part 60a of the housing 60 by the screw part 31b formed on the shell 31.

The stem 40 is formed from metal so as to be approximately in the shape of a rod. The stem 40 has a proximal end part 40a supported by the support member 50 and a distal end part 40b on which the LED module 20 is mounted. In the proximal end part 40a of the stem 40, two holes 40c through which the lead wires 70a and 70b pass are provided.

The support member 50 is formed from metal so as to be approximately in the shape of a circular disc. The support member 50 is fixed to the housing 60 so as to plug the opening 10a of the globe 10. At the center of the support member 50, a through-hole 50a through which the lead wires 70a and 70b pass is provided.

The housing 60 is formed from a resin material so as to be approximately in the shape of a cylinder. An inside diameter of an upper part of the housing 60 is approximately the same as an outside diameter of the support member 50. An inner circumferential surface of the housing 60 is partially in contact with an end surface of the support member 50. The screw part 60a is formed on an outer circumferential surface of a lower part of the housing 60. The screw part 60a is screwed into the shell 31 of the base 30.

The drive unit 80 converts alternating-current power supplied from the external power supply via the base 30 and the two lead wires 71a and 71b into direct-current power, and supplies the direct-current power resulting from the conversion to the LED module 20 via the lead wires 70a and 70b. The drive unit 80 is composed of a circuit board 80a such as a planar printed wiring board, and a plurality of lead-type electronic components 80b that include a coil and the like and are mounted on one surface of the circuit board 80a as a main surface.

Figure 3A:
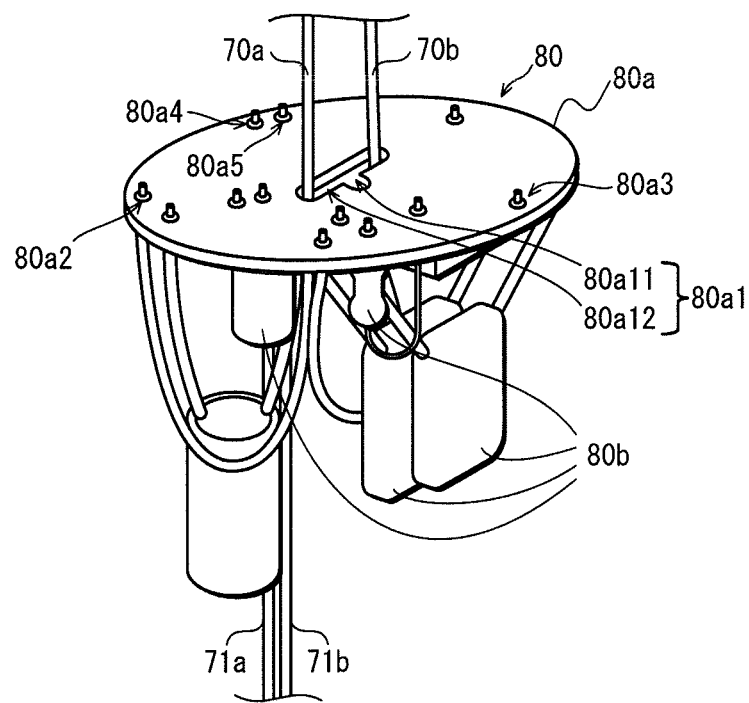
FIG. 3A is a schematic perspective view of a main part of the lamp pertaining to Embodiment 1.
Figure 3B:
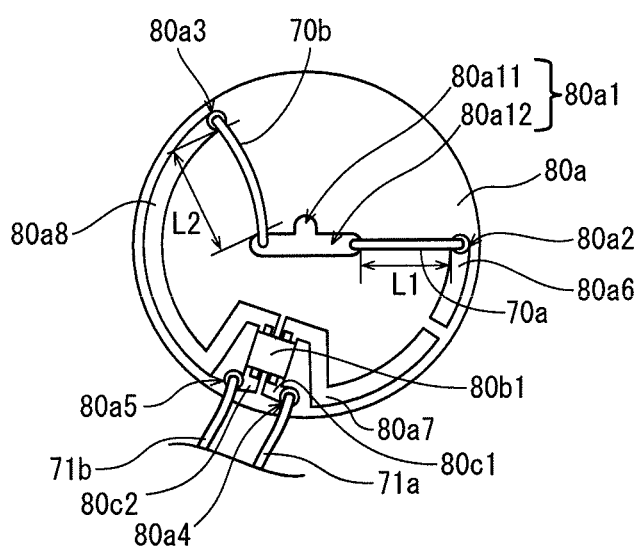
FIG. 3B is schematic plan view of the main part of the lamp pertaining to Embodiment 1 from which electronic components are omitted.

FIG. 3A illustrates an overall perspective view of the drive unit 80 viewed from a side of the solder surface opposite the main surface, and FIG. 3B illustrates the drive unit 80 which is viewed from a side of a surface on which the electronic components 80b are mounted, i.e. the main surface, and from which the electronic component 80b are omitted. The opposite surface refers to a back side of the circuit board 80a. A wiring pattern on the opposite surface is illustrated in FIG. 3B, which shows a view from a side of the main surface, for convenience' sake. As illustrated in FIGS. 3A and 3B, the circuit board 80a is formed so as to be circular in shape in plan view, and has a through-hole 80a1 approximately at a center thereof.

The through-hole 80a1 is approximately in a T shape by having a wide part 80a11 and two narrow parts 80a12 extending from the wide part 80a11 in different directions. Four holes 80a2, 80a3, 80a4, and 80a5 for respectively soldering the lead wires 70a, 70b, 71a, and 71b onto the circuit board 80a are provided in an edge part of the circuit board 80a. Power wiring patterns 80a6 and 80a8, and a grand pattern 80a7 on the circuit board 80a are provided along the edge part of the circuit board 80a. Two wiring patterns 80c1 and 80c2 are formed on parts of the edge part of the circuit board 80a. A diode bridge 80b1 is interposed between the wiring pattern 80c1 and the grand pattern 80a7, and between the wiring pattern 80c2 and the power wiring pattern 80a8.

In an area enclosed by the power wiring patterns 80a6 and 80a8, and the grand pattern 80a7, a wiring pattern (not illustrated) extending from each of the power wiring patterns 80a6 and 80a8, and the grand pattern 80a7 to a plurality of holes (not illustrated) for mounting the electronic components 80b is formed. The lead wires 70a and 70b respectively extend from the holes 80a2 and 80a3, and pass through the through-hole 80a1 from the main surface of the circuit board 80a on which the electronic components 80b are mounted to the opposite surface of the circuit board 80a.

During assembly of the drive unit 80, after the lead wires 70a and 70b are inserted into the wide part 80a11, the lead wire 70a is moved along one of the narrow parts 80a12, and the lead wire 70b is moved along the other one of the narrow parts 80a12. That is to say, the through-hole 80a1 has the wide part 80a11 to facilitate simultaneous insertion of the two lead wires 70a and 70b into the wide part 80a11 while achieving effective use of a circuit board area, and the lead wires 70a and 70b are then allocated to the respective narrow parts 80a12. As a result, the assembly of the drive unit 80 is facilitated. In the present embodiment, the wide part 80a1 has a width corresponding to the width of two lead wires to be inserted, and the narrow part 80a12 has a width corresponding to the width of a single lead wire.

The lead-type electronic components 80b include a smoothing capacitor, a current regulation resistor, and step-down and -up coils, and are attached to the circuit board 80a with leads thereof inserted into through-holes in the circuit board 80a. Specifically, as illustrated in FIG. 3A, the electronic components 80b are soldered in a state where ends of the leads of the electronic components 80b are inserted from the main surface of the circuit board 80a and protrude from the opposite surface of the circuit board 80a.

The lead wires 70a and 70b extend from the main surface of the circuit board 80a on which the electronic components 80b are mounted, and are connected to the feed terminals 24a and 24b of the LED module 20. The lead wires 71a and 71b extend from the main surface of the circuit board 80a, and are connected to the base 30. The lead wires 70a, 70b, 71a, and 71b are each a fluorocarbon resin insulated cable having a circular cross section. A recommended bend radius of the fluorocarbon resin cable is set in consideration of the fatigue characteristics (flex resistance) of an insulator. The bend radius R of the fluorocarbon resin insulated cable used for the lead wires 70a, 70b, 71a, and 71b is set to be at least six times greater than the outside diameter W of the cable.

The lead wires 70a and 70b pass through the through-hole 80a1 from the main surface of the circuit board 80a on which the electronic components 80b are mounted to the opposite surface of the circuit board 80a.

On the other hand, the lead wire 71a is electrically connected to the hole 80a4 at one end and to the eyelet 33 at the other end, and the lead wire 71b is electrically connected to the hole 80a5 at one end and to the shell 31 at the other end.

Figure 4:
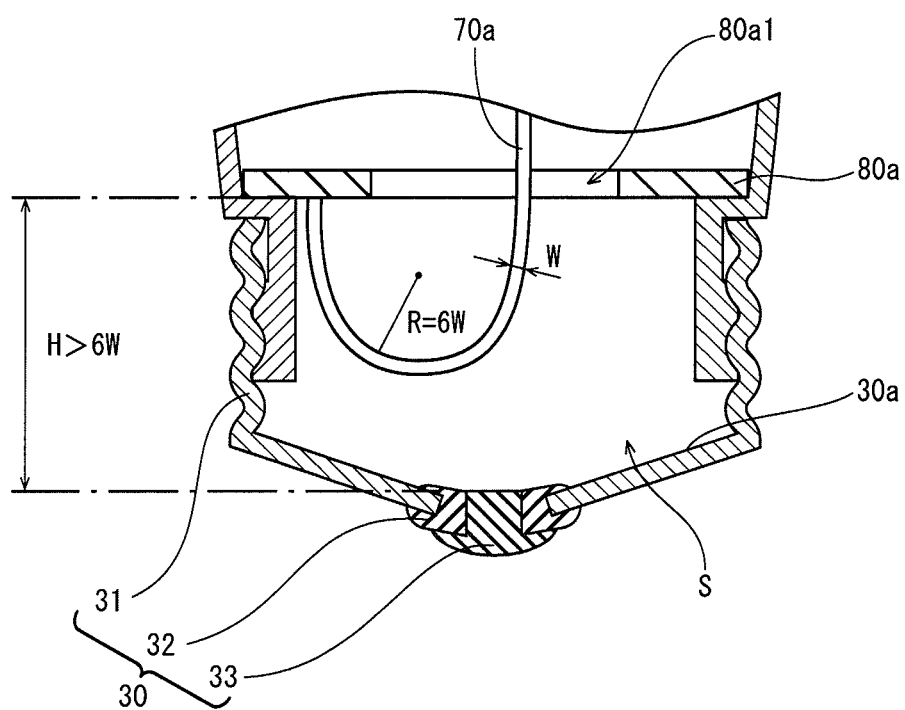
FIG. 4 is a schematic sectional view of a main part of the lamp pertaining to Embodiment 1.

As illustrated in FIGS. 3A, 3B, and 4, the minimum distance L1 between the through-hole 80a1 and a position 80a2 on the circuit board 80a from which the lead wire 70a extends is a distance determined based on the flex resistance of the lead wire 70a, i.e. a distance twice as great as an allowable bend radius of the lead wire 70a (12W). Similarly, the minimum distance L2 between the through-hole 80a1 and a position 80a3 on the circuit board 80a from which the lead wire 70b extends is a distance determined based on the flex resistance of the lead wire 70*b*, i.e. a distance twice as great as an allowable bend radius of the lead wire 70*b* (12W). A space S (see FIG. 4) is defined by the main surface of the circuit board 80*a* on which the electronic components 80*b* are mounted, an inner surface of the housing 60, and an inner surface of the base 30, and, in the space, the distance H between the main surface of the circuit board 80*a* and a bottom 30*a* of the base 30 is greater than the minimum bend radius 6W determined based on the flex resistance of the lead wire 70*a*. With this structure, since the bend radius of the lead wire 70*a* is set to be at least six times greater than the outside diameter of the lead wire 70*a*, breaking of the lead wire 70*a* is suppressed and the reliability of the lamp 1 is improved. The bend radius of the lead wire 70*b* is also set to be six times greater than the outside diameter of the lead wire 70*b*, so that breaking of the lead wire 70*b* is suppressed as with the lead wire 70*a*.

A flow soldering method is used to solder the lead-type electronic components 80*b*, and the lead wires 70*a*, 70*b*, 71*a*, and 71*b* onto the circuit board 80*a*. In the flow soldering method, the electronic components 80*b* are temporarily attached to the circuit board 80*a*, and then the surface of the circuit board 80*a* opposite the main surface on which the electronic components 80*b* are mounted is dipped into the solder bath containing high-temperature melted solder. The solder wets into each of the holes 80*a*2, 80*a*3, 80*a*4, and 80*a*5 through which the leads of the electronic components 80*b* pass, and, as a result, the electronic components 80*b* are soldered onto the circuit board 80*a*. In order not to cause the electronic components 80*b* to deteriorate by being dipped into the high-temperature solder bath during soldering, all the electronic components 80*b* are attached to the main surface of the circuit board 80*a*.

As described above, in the lamp 1 pertaining to the present embodiment, there is no need to leave, inside the housing 60, spaces to draw the lead wires 70*a* and 70*b* from the surface of the circuit board 80*a* opposite the main surface on which the electronic components 80*b* are mounted, in the vicinity of an outer periphery of the circuit board 80*a*. As a result, the housing 60 can be reduced in size accordingly, leading to miniaturization of the whole lamp 1.

Furthermore, since the electronic components 80*b*, and the lead wires 70*a* and 70*b* are provided on one surface of the circuit board 80*a*, the electronic components 80*b*, and the lead wires 70*a* and 70*b* can be mounted on the circuit board 80*a* by flow soldering having high productivity. As a result, automation and manufacturing costs can be reduced.

Figure 10:
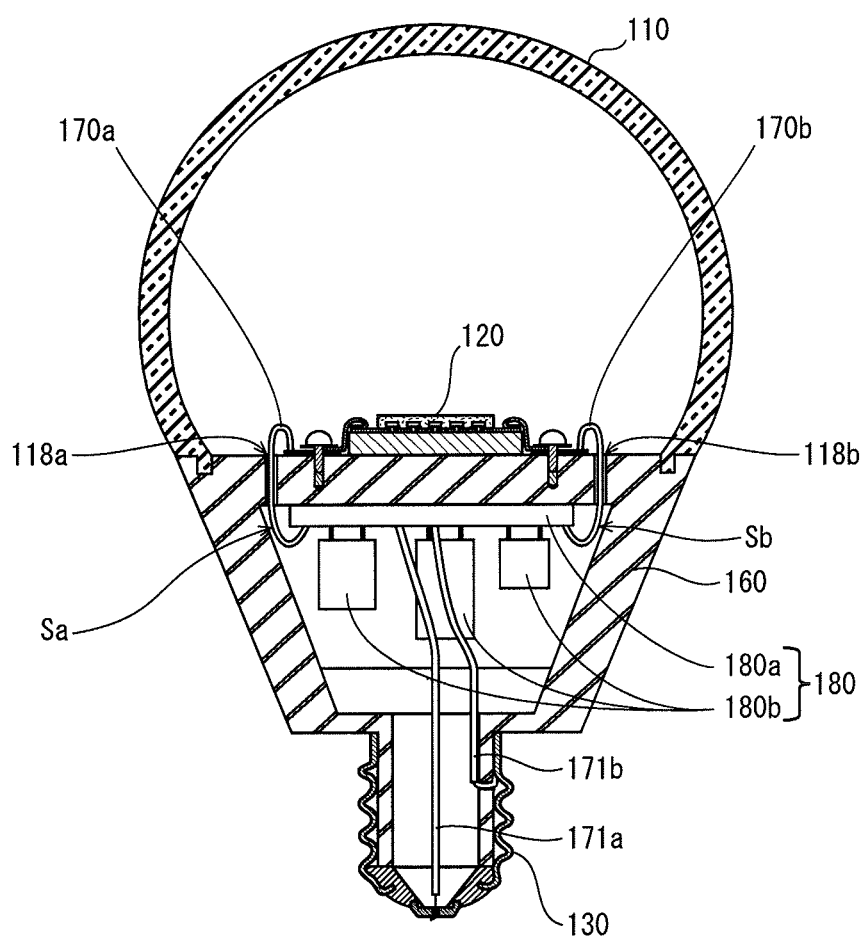
FIG. 10 is a schematic sectional view of a conventional lamp.

In addition, compared to the lamp 101 as illustrated in FIG. 10 in which distances between the through-holes 118*a* and 118*b* through which the lead wires 170*a* and 170*b* respectively pass and positions on the circuit board 180*a* from which the lead wires 170*a* and 170*b* extend are relatively small, and thus the bend radius of each of the lead wires 170*a* and 170*b* has to be reduced, the bend radius of each of the lead wires 70*a* and 70*b* can be increased. As a result, breaking of the lead wires 70*a* and 70*a* is suppressed and the reliability of the lamp 1 is improved.

Embodiment 2

Figure 5:
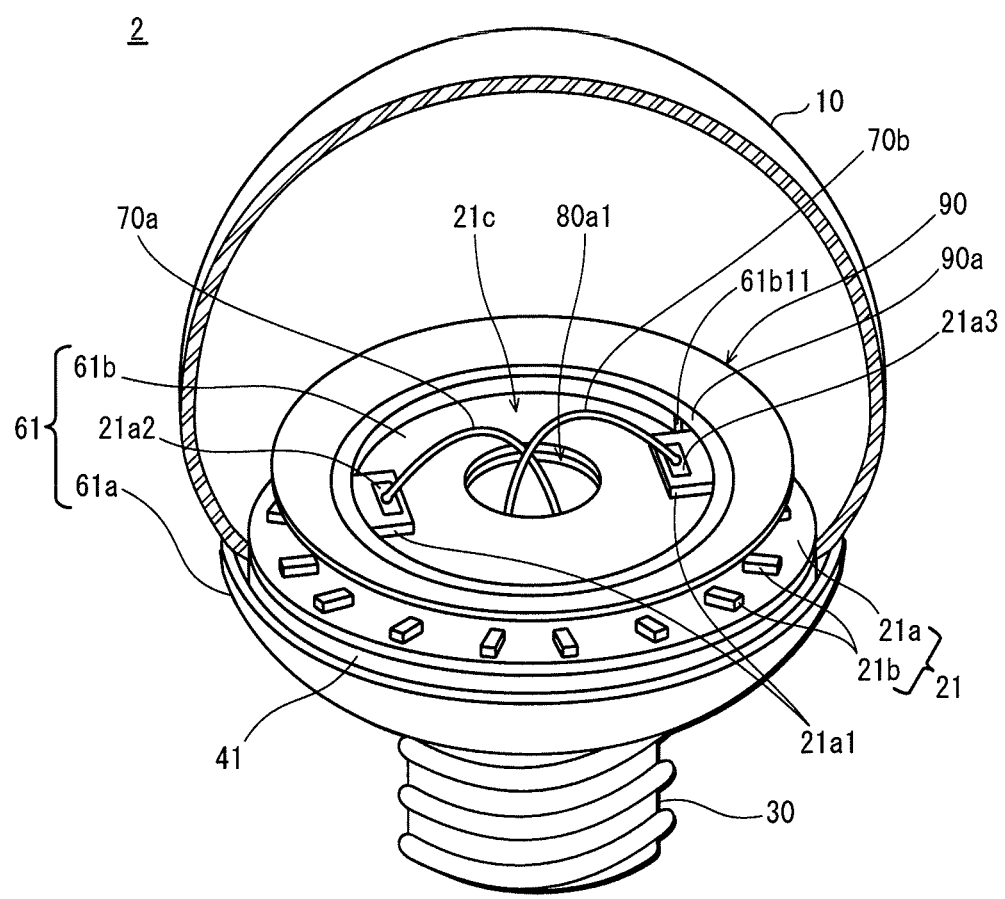
FIG. 5 is a schematic perspective partially-cutaway view of a lamp pertaining to Embodiment 2.
Figure 6:
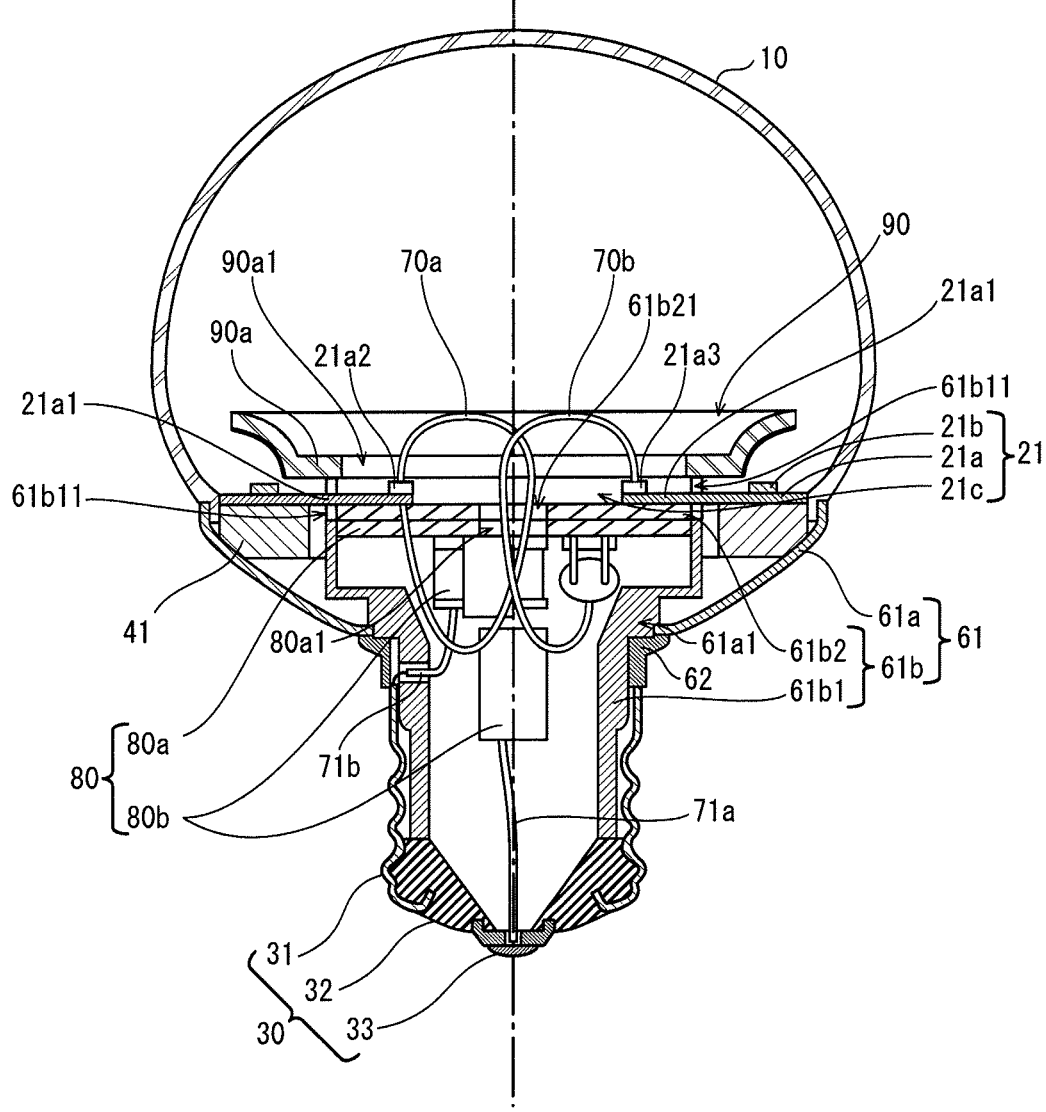
FIG. 6 is a schematic sectional view of the lamp pertaining to Embodiment 2.

As illustrated in FIGS. 5 and 6, a lamp 2 pertaining to Embodiment 2 includes an LED module 21 as a light source, the base 30, the globe 10, a mount 41, a beam splitter 90, a housing 61, and the drive unit 80.

As illustrated in FIG. 6, the lamp 2 further includes the lead wires (first lead wires) 70*a* and 70*b* for supplying power from the drive unit 80 to the LED module 21, and the lead wires (second lead wires) 71*a* and 71*b* for supplying power from the base 30 to the drive unit 80. Components similar to those in Embodiment 1 are assigned with the same reference signs, and description thereof is omitted appropriately.

The LED module 21 is composed of a substrate 21*a* and a plurality of LED elements 21*b* provided along an edge part of the substrate 21*a* at approximately equal intervals. Specifically, the substrate 21*a* is formed in the shape of a circular disc. The substrate 21*a* has an opening 21*c* at the center thereof in plan view, and two extending parts 21*a*1 extending inwards so as to oppose each other in a radial direction of the opening 21*c*. Feed terminals 21*a*2 and 21*a*3 are provided on the extending parts 21*a*1, and are electrically connected to the respective lead wires 70*a* and 70*b*.

The mount 41 is formed from a metal material so as to be in the shape of a ring having an approximately rectangular cross section. The LED module 21 is mounted on an upper surface of the mount 41.

The housing 61 is composed of an outside housing 61*a* formed from a metal material and an inside housing 61*b* formed from a synthetic resin.

The outside housing 61*a* is formed approximately in the shape of a bowl, and has, at a bottom thereof, an opening 61*a*1 that is circular in shape in plan view. The mount 41 is provided inside the outside housing 61*a* so as to enclose the opening 61*a*1. The globe 10, which is approximately in the shape of a hemisphere, is attached to the outside housing 61*a* so as to cover the outside housing 61*a*. An insulating member 62 is interposed between the outside housing 61*a* and the shell 31 of the base 30 so as to ensure insulation between the outside housing 61*a* and the shell 31 of the base 30.

The inside housing 61*b* is composed of a body part 61*b*1 and a lid part 61*b*2. The body part 61*b*1 is formed approximately in the shape of a cylinder and partially inserted into the opening 61*a*1 of the outside housing 61*a*. The lid part 61*b*2 is formed in the shape of a circular disc, and inserted into the body part 61*b*1 from above. The drive unit 80 is attached to the lid part 61*b*2. In a state where the body part 61*b*1 is fitted with the lid part 61*b*2, a surface of the lid part 61*b*2 to which the drive unit 80 is attached faces toward the inside of the inside housing 61*b*. A through-hole 61*b*21 that is circular in plan view is provided approximately at the center of the lid part 61*b*2 so that the lead wires 70*a* and 70*b* pass through the through-hole 61*b*21.

The body part 61*b*1 has cut-away parts 61*b*11 at positions in an upper part thereof corresponding to the extending parts 21*a*1 of the substrate 21*a* of the LED module 21. Edges of the extending parts 21*a*1 are inserted into the body part 61*b*1 via the cut-away parts 61*b*11.

The beam splitter 90 is formed from a light-transmissive material such as silica glass in the shape of a closed-end cylinder. A bottom 90*a* of the beam splitter 90 is attached to an upper end of the inside housing 61*b*. Approximately at the center of the bottom 90*a*, an opening 90*a*1 that is approximately circular in plan view is provided. The beam splitter 90 is formed approximately in the shape of a cylinder that gradually increases in outside diameter from a lower end to an upper end thereof.

As in Embodiment 1, the drive unit 80 is composed of the circuit board 80*a* that is circular in plan view and has the through-hole 80*a*1 at the center thereof, and the plurality of lead-type electronic components 80*b* mounted on the circuit board 80*a*. The lead wires 70*a*, 70*b*, 71*a*, and 71*b* are soldered into respective four holes (not illustrated) provided in an edge part of the circuit board 80*a* so as to be drawn from the main surface of the circuit board 80*a* on which the electronic components 80b are mounted. The four holes are electrically connected to a circuit including the electronic components 80b.

The lead wires 70a and 70b are drawn from the main surface of the circuit board 80a on which the electronic components 80b are mounted, and connected to the feed terminals 21a2 and 21a3 of the LED module 21. The lead wires 70a and 70b pass through the through-hole 80a1 from the main surface of the circuit board 80a on which the electronic components 80b are mounted to the opposite surface of the circuit board 80a. The lead wires 70a and 70b further pass through the opening 61b21 formed in the lid part 61b2 to the outside of the inside housing 61b, and are connected to the feed terminals 21a2 and 21a3 provided on the extending parts 21a1. The bend radius of each of the lead wires 70a and 70b is set to be a length determined based on the flex resistance of the each of the lead wires 70a and 70b, i.e. a length six times greater than the outside diameter of the each of the lead wires 70a and 70b.

The lead wires 71a and 71b are drawn from the main surface of the circuit board 80a, and connected to the base 30.

As described above, in the lamp 2 pertaining to the present embodiment, there is no need to leave, inside the inside housing 61b, spaces to draw the lead wires 70a and 70b from the surface of the circuit board 80a opposite the main surface on which the electronic components 80b are mounted, in the vicinity of the outer periphery of the circuit board 80a. As a result, the inside housing 61b can be reduced in size accordingly, leading to miniaturization of the whole lamp 2.

Furthermore, since the electronic components 80b, and the lead wires 70a and 70b are provided on one surface of the circuit board 80a, the electronic components 80b, and the lead wires 70a and 70b can be mounted on the circuit board 80a by flow soldering having high productivity. As a result, a manufacturing cost can be reduced.

In addition, compared to the lamp 101 as illustrated in FIG. 10 in which distances between the through-holes 118a and 118b, into which the lead wires 170a and 170b are respectively inserted, and positions on the circuit board 180a from which the lead wires 170a and 170b are drawn are relatively small, and thus the bend radius of each of the lead wires 170a and 170b has to be reduced, the bend radius of each of the lead wires 70a and 70b can be increased. As a result, breaking of the lead wires 70a and 70a is suppressed and the reliability of the lamp 2 is improved.

Embodiment 3

Figure 7:
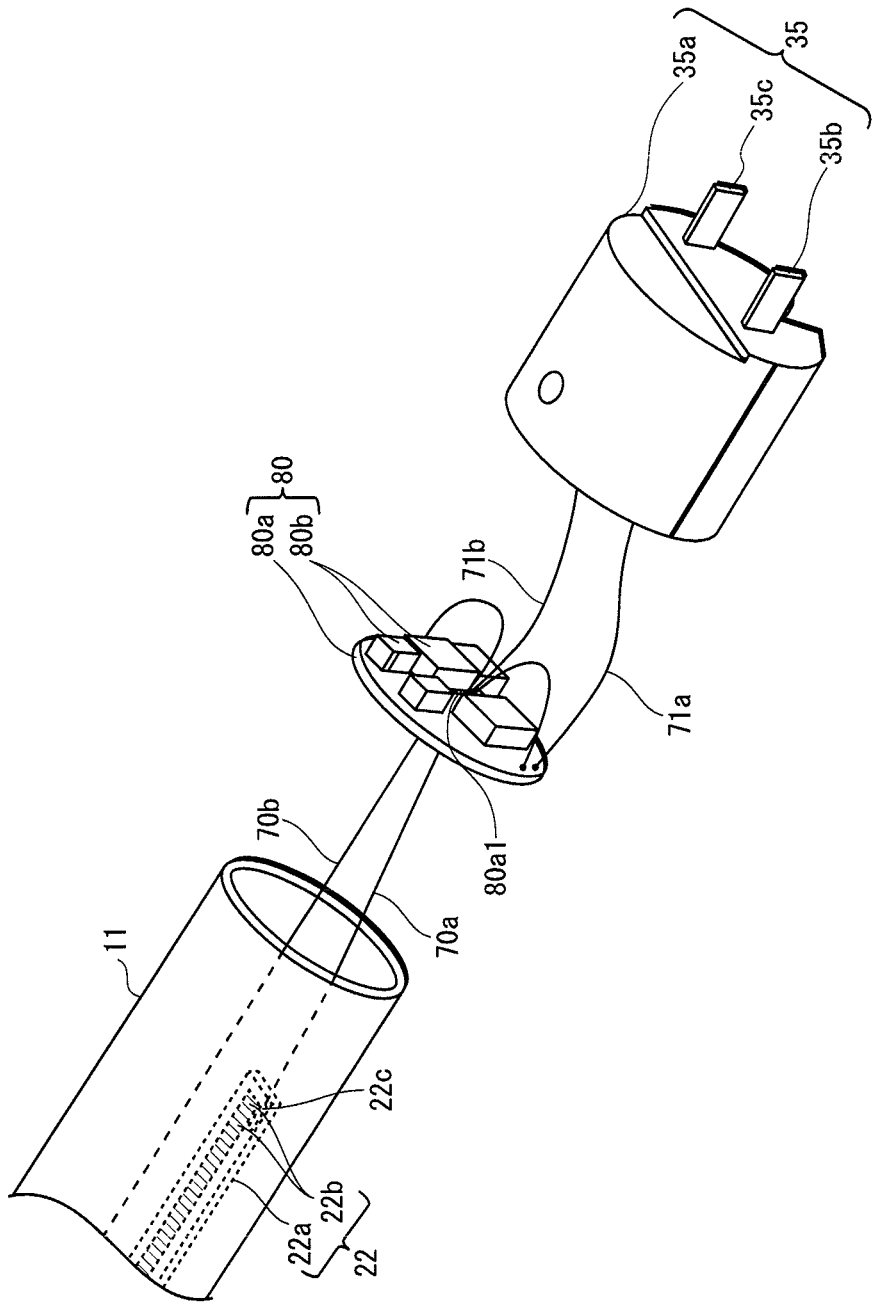
FIG. 7 is a schematic exploded perspective view of a lamp pertaining to Embodiment 3.

A lamp 3 pertaining to Embodiment 3 is an LED lamp in the shape of a straight fluorescent lamp. As illustrated in FIG. 7, the lamp 3 includes an LED module 22, a straight glass tube 11 for housing therein the LED module 22, bases 35 attached to respective ends of the glass tube 11, and the drive unit 80. The lamp 3 further includes the lead wires (first lead wires) 70a and 70b for supplying power from the drive unit 80 to the LED module 22, and the lead wires (second lead wires) 71a and 71b for supplying power from the base 35 to the drive unit 80. Components similar to those in Embodiment 1 are assigned with the same reference signs, and description thereof is omitted appropriately.

The LED module 22 is composed of an elongated substrate 22a and a plurality of LED elements 22b provided along the length of the substrate 22a. The plurality of LED elements 22b are electrically connected in series to one another by a wiring pattern (not illustrated) formed on the substrate 22a.

Feed terminals 22c, only one of which is illustrated in FIG. 7, are provided at respective ends of the substrate 22a in the longitudinal direction thereof.

The glass tube 11 has the same dimension as a glass tube before sealing of both ends thereof used for manufacture of a fluorescent lamp determined by Japanese Industrial Standards (JIS), and has the same outside diameter as an arc tube (glass tube) of a fluorescent lamp conforming to JIS (5.3 of JIS C 7617-2).

The base 35 includes a body part 35a formed from a synthetic resin in the shape of a closed-end cylinder, and a pair of base pins 35b and 35c formed from a metal material. The base 35 conforms, for example, to G13 specifications.

As in Embodiment 1, the drive unit 80 is composed of the circuit board 80a that is circular in plan view and has the through-hole 80a1 at the center thereof, and the plurality of lead-type electronic components 80b mounted on the circuit board 80a.

The lead wires 70a and 70b extend from the main surface of the circuit board 80a on which the electronic components 80b are mounted, and are connected to the feed terminals 22c of the LED module 22. The lead wires 70a and 70b pass through the through-hole 80a1 from the main surface of the circuit board 80a on which the electronic components 80b are mounted to the opposite surface of the circuit board 80a. The bend radius of each of the lead wires 70a and 70b is set to be a length determined based on the flex resistance of the each of the lead wires 70a and 70b, i.e. a length six times greater than the outside diameter of the each of the lead wires 70a and 70b.

The lead wires 71a and 71b extend from the main surface of the circuit board 80a, and are connected to the base pins 35b and 35c of the base 35.

As described above, in the lamp 3 pertaining to the present embodiment, there is no need to leave, inside the base 35, spaces to draw the lead wires 70a and 70b from the surface of the circuit board 80a opposite the main surface on which the electronic components 80b are mounted, in the vicinity of the outer periphery of the circuit board 80a. As a result, the base 35 can be reduced in size accordingly.

Furthermore, since the electronic components 80b, and the lead wires 70a and 70b are provided on one surface of the circuit board 80a, the electronic components 80b, and the lead wires 70a and 70b can be mounted on the circuit board 80a by flow soldering having high productivity. As a result, a manufacturing cost can be reduced.

In addition, compared to the lamp 101 as illustrated in FIG. 10 in which distances between the through-holes 118a and 118b, into which the lead wires 170a and 170b are respectively inserted, and positions on the circuit board 180a from which the lead wires 170a and 170b extend are relatively small, and thus the bend radius of each of the lead wires 170a and 170b has to be reduced, the bend radius of each of the lead wires 70a and 70b can be increased. As a result, breaking of the lead wires 70a and 70a is suppressed and the reliability of the lamp 3 is improved.

<Modifications>

(1) The lamps in Embodiments 1, 2, and 3 as described above are configured to include the LED modules 20, 21, and 22, respectively. The configuration of each of the lamps, however, is not limited to such configuration. For example, each of the lamps may include a light-emitting module having an organic electroluminescence (EL) element, an inorganic EL element, and the like.

Figure 8:
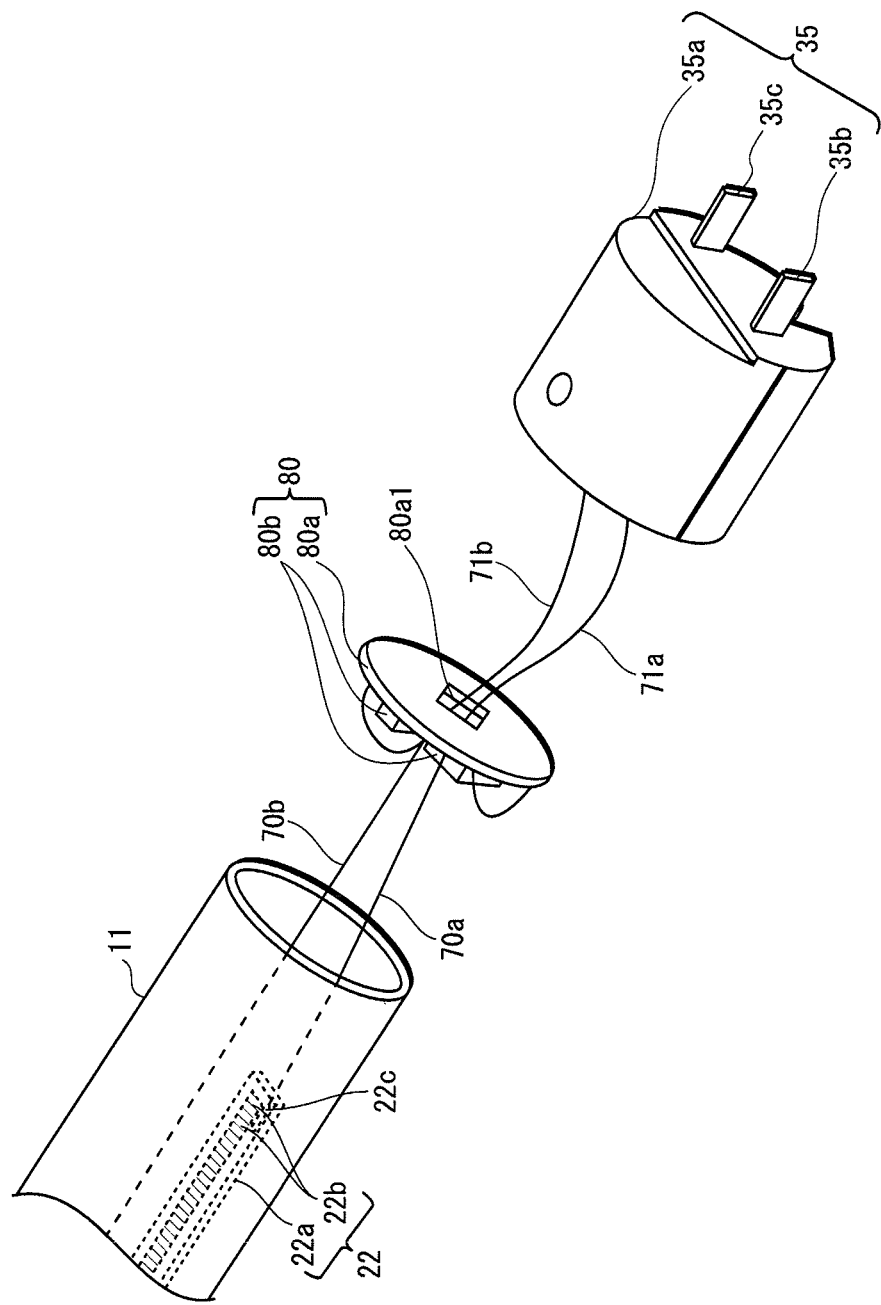
FIG. 8 is a schematic exploded perspective view of a lamp pertaining to Modification.

(2) In Embodiment 3 as described above, the drive unit 80 is configured so that the main surface of the circuit board 80a on which the electronic components 80b are mounted faces the base pins 35b and 35c and the opposite surface of the circuit board 80a faces the LED module 22. The configuration of the drive unit 80, however, is not limited to such configuration. For example, as illustrated in FIG. 8, the LED module 22 may be provided so as to face the main surface of the circuit board 80a on which the electronic components 80b are mounted, and the base pins 35b and 35c may be provided so as to face the opposite surface of the circuit board 80a. In this case, the lead wires 71a and 71b are led from the main surface of the circuit board 80a to the opposite surface of the circuit board 80a.

In Embodiments 1 and 2 as described above, the drive unit 80 is configured so that the main surface of the circuit board 80a on which the electronic components 80b are mounted faces the base 30, and the opposite surface of the circuit board 80a faces the LED modules 20 and 21. The configuration of the drive unit 80, however, is not limited to such configuration. For example, the LED modules 20 and 21 may be provided so as to face the main surface of the circuit board 80a on which the electronic components 80b are mounted, and the base 30 may be provided so as to face the opposite surface of the circuit board 80a. The lead wires 71a and 71b may thus be led from the main surface of the circuit board 80a to the opposite surface of the circuit board 80a.

(3) In Embodiments 1, 2, and 3 as described above, the drive unit 80 is configured so that the electronic components 80b are mounted only on the main surface of the circuit board 80a. The configuration of the drive unit 80, however, is not limited to such configuration. For example, a surface-mount electronic component to be soldered by a reflow soldering method may be mounted on the opposite surface of the circuit board 80a. Furthermore, the surface-mount electronic component to be soldered by the reflow soldering method may be mounted on the main surface of the circuit board 80a.

(4) In Embodiments 1, 2, and 3 as described above, the through-hole 80a1 is approximately in the T shape. The shape of the through-hole 80a1, however, is in no way limited. For example, the through-hole 80a1 may be in the shape of a rectangle, circle, or ellipse in plan view. Alternatively, the through-hole 80a1 may be in the shape of a cross in plan view.

(5) In Embodiments 1, 2, and 3 as described above, the through-hole 80a1 is provided approximately at the center of the circuit board 80a. The position of the through-hole 80a1, however, is in no way limited. For example, the through-hole 80a1 may be formed at a position offset from the center of the circuit board 80a to the outer circumference of the circuit board 80a.

(6) In Embodiment 1 as described above, the lamp is configured so that the lead wires 70a, 70b, 71a, and 71b are soldered onto the circuit board 80a. The configuration of the lamp, however, is not limited to such configuration.

Figure 9A:
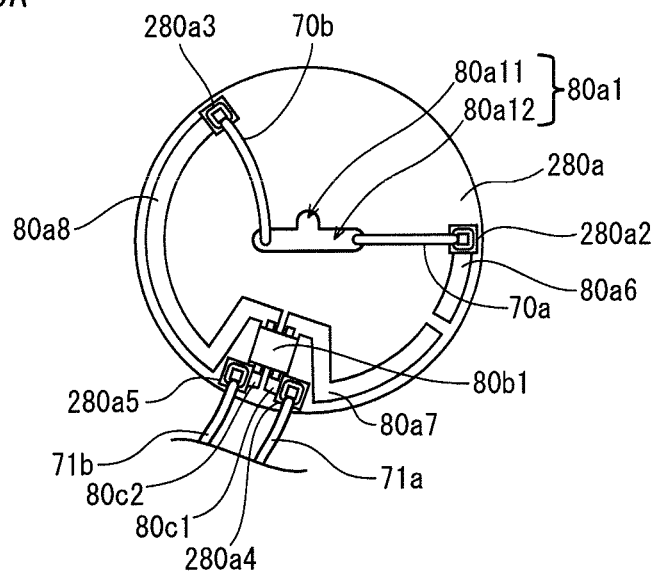
FIG. 9A is schematic plan view of a main part of a lamp pertaining to Modification from which electronic components are omitted.
Figure 9B:
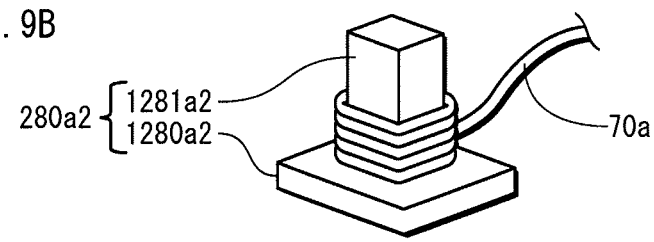
FIG. 9B is a perspective view of a wrapping terminal of the lamp pertaining to Modification.
Figure 9C:
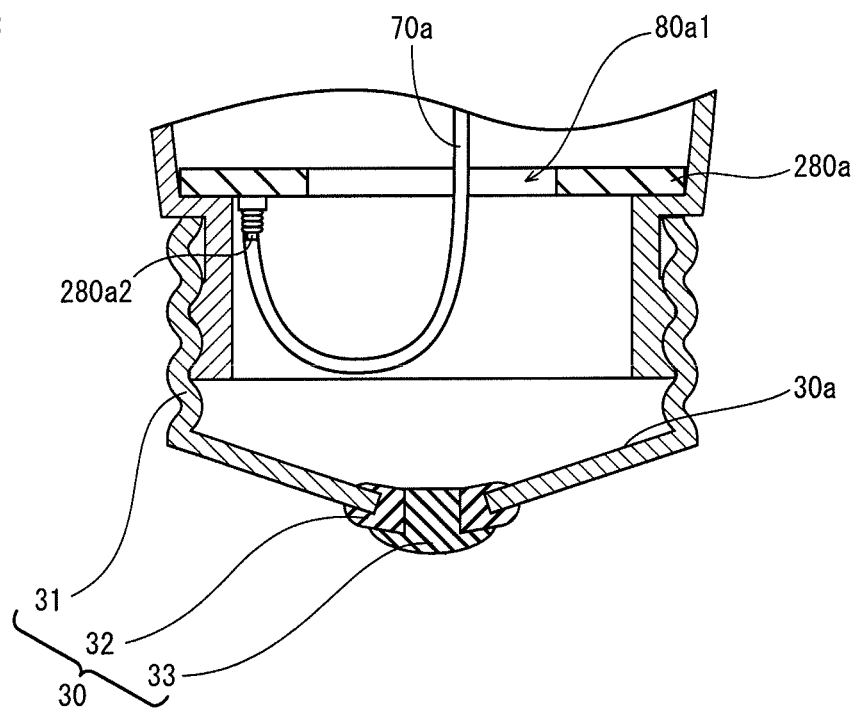
FIG. 9C is a schematic sectional view of a main part of the lamp pertaining to Modification.

FIG. 9A is schematic plan view of a main part of a lamp pertaining to the present modification from which electronic components are omitted, FIG. 9B is a perspective view of a wrapping terminal 280a2 of the lamp pertaining to the present modification, and FIG. 9C is a schematic sectional view of a main part of the lamp pertaining to the present modification. Components similar to those in Embodiment 1 are assigned with the same reference signs, and description thereof is omitted appropriately.

As illustrated in FIG. 9A, in the lamp pertaining to the present modification, the lead wire 70a is electrically connected to the power wiring pattern 80a6 on the circuit board 280a via the wrapping terminal 280a2. Similarly, the lead wire 70b is electrically connected to the power wiring pattern 80a8 on the circuit board 280a via a wrapping terminal 280a3. Furthermore, the lead wires 71a and 71b are electrically connected to the wiring patterns 80c1 and 80c2 on the circuit board 280a via wrapping terminals 280a4 and 280a5, respectively.

As illustrated in FIG. 9B, the wrapping terminal 280a2 is composed of a mount 1280a2 in the shape of a rectangular plate, and a pin 1281a2 in the shape of a prism protruding from the main surface of the mount 1280a2. On a back side of the mount 1280a2, which is a surface of the mount 1280a2 opposite the main surface, a metal pad (not illustrated) for electrically connecting the power wiring pattern 80a6 formed on the circuit board 280a to the pin 1281a2 is formed. The wrapping terminal 280a2 is provided on the circuit board 280a2 with the metal pad soldered onto the power wiring pattern 80a6. The wrapping terminals 280a3, 280a4, and 280a5 have similar structures. As illustrated in FIGS. 9B and 9C, an end part of the lead wire 70a at which a core wire is exposed is wound around the pin 1281a2 of the wrapping terminal 280a2. In a state where the end part of the lead wire 70a at which the core wire is exposed is wound around the pin 1281a2 of the wrapping terminal 280a2 as described above, the core wire eats into edge parts of the pin 1281a2 in the shape of the prism. With this structure, the lead wire 70a and the wrapping terminal 280a2 are maintained in a conductive state. The lead wires 70b, 71a, and 71b are also wound around pins of the wrapping terminals 280a3, 280a4, and 280a5, respectively. The present modification has an advantageous effect that the lead wires 70a, 70b, 71a, and 71b are easily removed/attached from/to the circuit board 280a, as the lead wires 70a, 70b, 71a, and 71b can easily be removed from the respective wrapping terminals 280a2, 280a3, 280a4, and 280a5.

Connector components other than the wrapping terminals 280a3, 280a4, and 280a5 may be used instead.

INDUSTRIAL APPLICABILITY

The lamp pertaining to the present invention is widely applicable for use in lighting.

REFERENCE SIGNS LIST 1, 2, 3 lamp
10 globe
11 glass tube
20, 21, 22 LED module (light source)
30, 35 base
35b, 35c base pin
31 shell
32 insulating member
33 eyelet
40 stem
50 support member
60, 61 housing
61a outside housing
61b inside housing
70a, 70b lead wire (first lead wire)
71a, 71b lead wire (second lead wire)
80 drive unit
80a circuit board
80a1 through-hole
80b electronic component
280a2, 280a3, 280a4, 280a5 wrapping terminal

The invention claimed is:
1. A lamp comprising:
a feed unit configured to receive power from an external power supply;
a light source;

a drive unit located between the feed unit and the light source; and a support member located between the drive unit and the light source, supporting the light source, wherein the drive unit includes:

a circuit board having a first main surface facing the feed unit, a second main surface facing the light source, and a through-hole at a central part of the circuit board, extending from the first main surface to the second main surface, an electric component being mounted on the first main surface;

a first lead wire connected to an edge part of the first main surface at one end and connected to the light source at the other end; and a second lead wire extending from the first main surface and connected to the feed unit, the support member is located opposite the second main surface of the circuit board and has a through-hole at a central part of the support member, a minimum distance between the through-hole of the circuit board and the edge part of the first main surface where the first lead wire is connected is at least a distance determined based on flex resistance of the first lead wire, and the first lead wire passes through the through-hole of the circuit board and the through-hole of the support member.

2. The lamp according to claim 1, wherein
the through-hole has a wide part and two narrow parts extending from the wide part in different directions in plan view.

3. The lamp according to claim 1, wherein
the through-hole is in a T shape.

4. The lamp according to claim 1, wherein
the feed unit is a base.

5. The lamp according to claim 4, further comprising
a housing that is tubular and houses the drive unit therein, wherein the base is in a shape of a closed-end tube, and is attached to the housing so as to cover an opening of the housing, and a space is defined by the first main surface of the circuit board, an inner surface of the housing, and an inner surface of the base, and, in the space, a distance between the first main surface and a bottom of the base is equal to or greater than a minimum bend radius of the first lead wire determined based on the flex resistance of the first lead wire.

6. The lamp according to claim 5, wherein
the housing is cylindrical, and a first end and a second end of the housing along a central axis of the housing differ in diameter such that the first end has a smaller diameter than the second end, the base is attached to the first end of the housing, the central axis of the housing intersects with the circuit board, and the circuit board is located closer to the second end of the housing than a central part of the housing along the central axis of the housing.

7. The lamp according to claim 1, wherein
the electric component is mounted on the first main surface of the circuit board by soldering the second main surface using a flow soldering method.

8. The lamp according to claim 6, wherein
the electric component is mounted on the first main surface of the circuit board by soldering the second main surface using a flow soldering method.

9. The lamp according to claim 1, wherein
the light source is an LED module.

10. The lamp according to claim 8, wherein
the light source is an LED module.

* * * * *